United States Patent
Oh

(10) Patent No.: US 8,158,305 B2
(45) Date of Patent: Apr. 17, 2012

(54) PHOTOMASK FOR EXTREME ULTRAVIOLET LITHOGRAPHY AND METHOD FOR FABRICATING THE SAME

(75) Inventor: Sung Hyun Oh, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 29 days.

(21) Appl. No.: 12/649,566

(22) Filed: Dec. 30, 2009

(65) Prior Publication Data

US 2010/0304277 A1    Dec. 2, 2010

(30) Foreign Application Priority Data

May 26, 2009  (KR) .................. 10-2009-0046206

(51) Int. Cl.
*G03F 1/00* (2012.01)
(52) U.S. Cl. .......................................................... 430/5
(58) Field of Classification Search ............... 430/5, 311; 378/35; 204/192.11
See application file for complete search history.

(56) References Cited

U.S. PATENT DOCUMENTS

| | | | |
|---|---|---|---|
| 5,480,747 A * | 1/1996 | Vasudev | 430/5 |
| 2004/0009408 A1 | 1/2004 | Fisch et al. | |
| 2008/0318138 A1 | 12/2008 | Holfeld | |
| 2009/0220869 A1* | 9/2009 | Takai | 430/5 |

FOREIGN PATENT DOCUMENTS

| | | |
|---|---|---|
| JP | 06-095358 A | 4/1994 |
| JP | 2008-535270 A | 8/2008 |
| JP | 2009-021582 A | 1/2009 |
| KR | 10-2006-0096098 | 9/2006 |

* cited by examiner

*Primary Examiner* — Stephen Rosasco
(74) *Attorney, Agent, or Firm* — Marshall, Gerstein & Borun LLP

(57) ABSTRACT

A method for fabricating a photomask for extreme ultraviolet lithography is provided. A reflection layer reflecting extreme ultraviolet light is formed over a transparent substrate having a main chip region and a frame region. A phase shifter pattern is formed over the reflection layer to selectively expose the reflection layer. An absorber pattern is formed over the phase shifter pattern of the frame region. A reflectivity reduction region guiding the shielding of the extreme ultraviolet light is formed in the absorber pattern.

17 Claims, 4 Drawing Sheets

PHOTOMASK FOR EXTREME ULTRAVIOLET LITHOGRAPHY AND METHOD FOR FABRICATING THE SAME

CROSS-REFERENCES TO RELATED APPLICATION

The priority benefit of Korean application number 10-2009-0046206, filed on May 26, 2009, which is incorporated by reference in its entirety, is claimed.

BACKGROUND OF THE INVENTION

1. Field of the Invention

The invention relates to a photomask and a method for fabricating the same, and more particularly, to a phase shift mask for extreme ultraviolet lithography and a method for fabricating the same.

2. Brief Description of Related Technology

As the semiconductor fabrication process becomes complicated and the integration density of semiconductor devices increases, finer patterns are increasingly demanded. To overcome the limiting resolution of the lithography process for forming fine patterns, extensive research has been conducted on extreme ultraviolet lithography technology which uses 13.5 nanometers (nm) extreme ultraviolet (EUV) light, which is shorter than a KrF or ArF light source generally used in an exposure process.

A photomask for extreme ultraviolet lithography has an optical reflection structure, in which a mufti-layered reflection layer including Mo/Si layers is formed on a transparent substrate, and an absorber pattern is formed on the reflection layer in a pattern shape that will be transferred onto a wafer. When extreme ultraviolet light is irradiated onto the mask for extreme ultraviolet lithography, the extreme ultraviolet light is absorbed at the absorber pattern and is reflected at the surface of the reflection layer.

Meanwhile, extreme ultraviolet light is irradiated or reflected not at a vertical angle but at an inclined incident angle with respect to the surface of the mask, for example, in a range from approximately 5° to approximately 6°. At this time, a height difference between the absorber pattern and the surface of the reflection layer forms a shadow region in which extreme ultraviolet light is neither irradiated nor reflected. Therefore, light irradiated onto and reflected from the mask for extreme ultraviolet lithography is incident on the wafer while its incident direction is slightly changing. Consequently, a shadow effect is caused. That is, a critical dimension or position of a pattern formed on the wafer is changed. To suppress the shadow effect, the height difference of the region where extreme ultraviolet light is absorbed and reflected is reduced by forming the absorber layer thinly in the fabrication of the mask for extreme ultraviolet lithography.

FIG. 1 is a plan view illustrating a structure of a phase shift mask for extreme ultraviolet lithography.

Referring to FIG. 1, a main chip region 110 where main patterns are formed is disposed at a center portion of the mask 100, and a frame region 120 is disposed to surround the main chip region 110. The main chip region 110 corresponds to an exposure field region where a one-time exposure process is performed, and the frame region 120 is a light shielding region which is not used in substantially transferring patterns such as bar codes onto the wafer.

However, if an absorber pattern is formed thinly, the absorber pattern does not serve as the light shielding pattern, and partially transmits the incident extreme ultraviolet light. Consequently, multiple exposure regions are formed during a wafer exposure process. That is, if the exposure regions are overlapped during the wafer exposure process, the overlapped regions are exposed doubly as the absorber pattern serving as the light shielding pattern is thinner. As a result, an image contrast of the region which is exposed doubly or multiply is degraded, causing wafer pattern failure.

SUMMARY OF THE INVENTION

In one embodiment, a photomask for extreme ultraviolet lithography includes a reflection layer disposed over a transparent substrate. The reflection layer is capable of reflecting extreme ultraviolet light incident thereon. The transparent substrate has a main chip region and a frame region. The photomask also includes a phase shifter pattern disposed over the reflection layer that selectively exposes the reflection layer. Furthermore, the photomask includes an absorber pattern disposed over the phase shifter pattern of the frame region. Still further, the photomask includes a reflectivity reduction region disposed in the absorber pattern. The reflectivity reduction region is capable of guiding the shielding of the extreme ultraviolet light.

In another embodiment, a method for fabricating a photomask for extreme ultraviolet lithography includes forming a reflection layer capable of reflecting extreme ultraviolet light incident thereon over a transparent substrate having a main chip region and a frame region. The method also includes forming a phase shifter pattern over the reflection layer to selectively expose the reflection layer, forming an absorber pattern over the phase shifter pattern of the frame region, and forming a reflectivity reduction region in the absorber pattern, the reflectivity reduction region capable of guiding the shielding of the extreme ultraviolet light.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1:
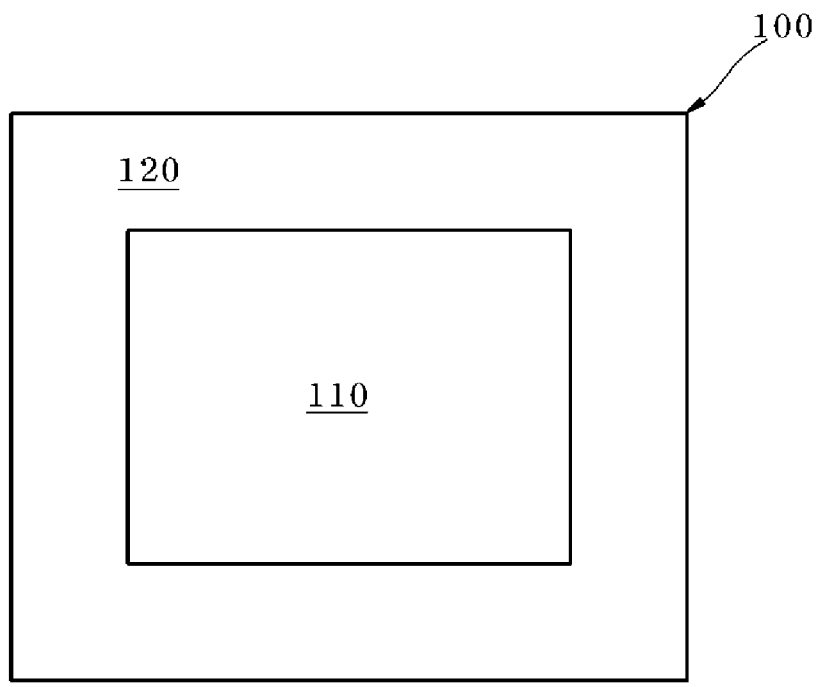
FIG. 1 is a plan view illustrating a structure of a phase shift mask for extreme ultraviolet lithography; and, FIGS. 2 through 7 illustrate a method for fabricating a photomask for extreme ultraviolet lithography according to an embodiment of the invention.

While the disclosed photomask and its method of fabrication are susceptible of embodiments in various forms, there are illustrated in the drawings (and will hereafter be described) specific embodiments, with the understanding that the disclosure is intended to be illustrative, and is not intended to limit the invention to the specific embodiments described and illustrated herein.

DESCRIPTION OF SPECIFIC EMBODIMENTS

Hereinafter, exemplary embodiments of the present invention will be described in detail with reference to the accompanying drawings.

FIGS. 2 through 7 illustrate a method for fabricating a photomask for extreme ultraviolet lithography according to an embodiment of the present invention.

First, a photomask for extreme ultraviolet lithography according to an embodiment of the present invention will be described with reference to FIGS. 6 and 7.

The photomask for extreme ultraviolet lithography according to an embodiment of the present invention includes a reflection layer 310, a phase shifter pattern 331, an absorber pattern 341, and a reflectivity reduction region 360. The reflection layer 310 is disposed over a transparent substrate 300 including a main chip region 210 and a frame region 220, and reflects an incident extreme ultraviolet light. The phase shifter pattern 331 is disposed the reflection layer 310 to selectively expose the reflection layer 310. The absorber pattern 341 is disposed over the phase shifter pattern 331 of the frame region 220. The reflectivity reduction region 360 is disposed in the absorber pattern 341 to guide and shield the extreme ultraviolet light.

The reflection layer 310 may have a multi-layered structure in which a plurality of double layers each including a molybdenum layer 311 and a silicon layer 312 are stacked.

The phase shifter pattern 331 is disposed so that a first reflected light which is reflected directly from the reflection layer 310 and a second reflected light which passes through the phase shifter pattern 331 and then is reflected have a 180-degree phase difference. The phase shifter pattern 331 may include a tantalum nitride (TaN) film having a thickness ranging from approximately 58.2 nm to approximately 62.4 nm.

A capping layer 320 protecting the reflection layer 310 may be further provided over the reflection layer 310.

The absorber pattern 341 may include a tantalum boron nitride (TaBN) or tantalum boron oxynitride (TaBON) film.

The reflectivity reduction region 360 includes a carbon doping region or an oxygen doping region. The reflectivity reduction region 360 is disposed in a width range from approximately 1 nm to approximately 2 nm from the boundary of the main chip region 210 and the frame region 220. By disposing the reflection reduction region 360 at the boundary of the main chip region 210 and the frame region 220, it is possible to prevent multiple exposure in the overlapped region between adjacent exposure regions, even if an alignment error occurs in an exposure apparatus.

Next, a method for fabricating a photomask for extreme ultraviolet lithography according to an embodiment of the present invention will be described with reference to FIGS. 2 through 7.

Figure 2:
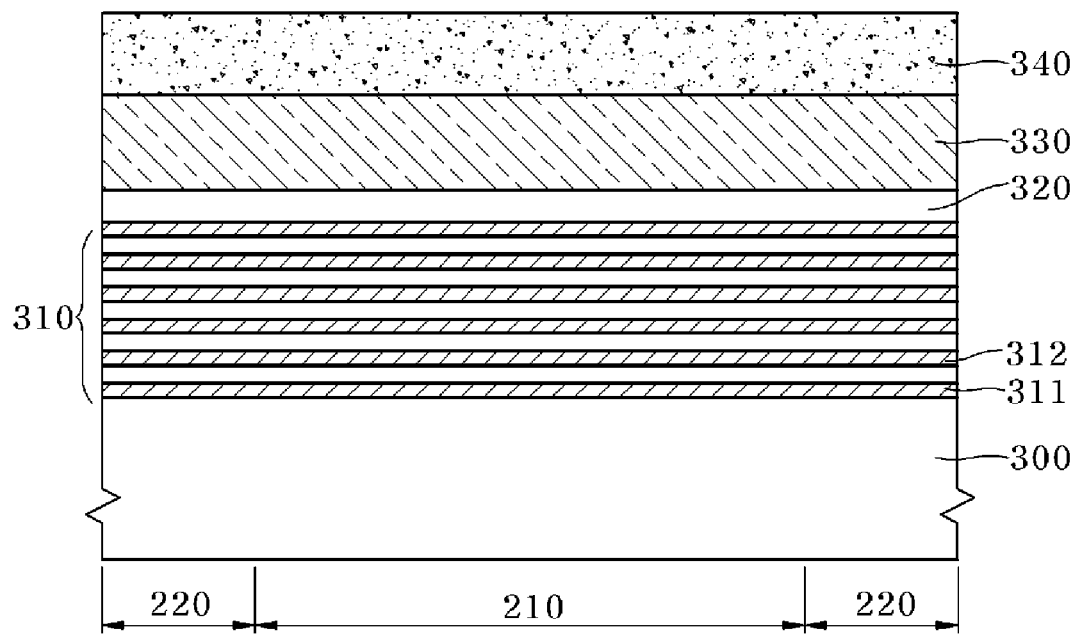

Referring to FIG. 2, a reflection layer 310 reflecting an extreme ultraviolet light is formed over a transparent substrate 300, and a capping layer 320 is formed over the reflection layer 310. The transparent substrate 300 may be a quartz substrate having a low thermal expansion coefficient (LTE). A main chip region 210 where main patterns are formed is disposed at the center portion of the mask for extreme ultraviolet lithography, and a frame region 220 is disposed to surround the main chip region 210. The main chip region 210 corresponds to an exposure field region where a one-time exposure process is performed, and the frame region 220 is a region which is not used in substantially transferring patterns such as bar codes onto the wafer.

The reflection layer 310 is formed by stacking a plurality of double layers each including a molybdenum layer 311 and a silicon layer 312 in order to reflect the extreme ultraviolet light. The reflection layer 310 may be formed to a thickness sufficient to reflect the extreme ultraviolet light. The reflection layer 310 reflects the extreme ultraviolet light, based on a constructive interference of reflection occurring at the interface between the molybdenum layer 311 and the silicon layer 312, that is, a distributed Bragg reflector principle.

The capping layer 320 may include a silicon layer (not shown). The capping layer 320 is formed relatively thicker than the silicon layer 312 of the reflection layer 310. The capping layer 320 maintains about 60% or more reflectivity of the extreme ultraviolet light by suppressing the unwanted oxidation or doping of the reflection layer 320.

A phase shifter layer 330 is formed over the capping layer 320, and an absorber layer 340 is formed over the phase shifter layer 330. The phase shifter layer 330 may include a tantalum nitride (TaN) film having a thickness ranging from approximately 58.2 nm to approximately 62.4 nm. The absorber layer 340 may include a material absorbing the incident extreme ultraviolet light, for example, tantalum boron nitride (TaBN) or tantalum boron oxynitride (TaBON).

The phase shifter layer 330 shifts the phase of the reflected light which passes through the phase shifter layer 330 and then is reflected, depending on a difference between a material of the phase shifter layer 330 and a material of the phase shifter layer 330, and a thickness of the phase shifter layer 330. For example, the phase shifter layer 330 is formed so that a first reflected light, which is reflected directly from the reflection layer 310, and a second reflected light, which passes through the phase shifter layer 330 and then is reflected, have a 180-degree phase difference. When the thickness of the TaN film of the phase shifter layer 330 ranges from approximately 58.2 nm to approximately 62.4 nm, the phase shifter layer 330 serves as a phase shifter to ensure that the first reflected light and the second reflected light have a 180-degree phase difference.

Because the reflection layer 310 may reflect approximately 60% to 70% of the incident extreme ultraviolet light, the phase shifter layer 330 reflects a part of the extreme ultraviolet light incident having a relatively low intensity compared to the reflection layer 310. The absorber layer 340 is disposed in the frame region 220 to absorb the extreme ultraviolet light incident on or reflected from the frame region 220.

Figure 3:
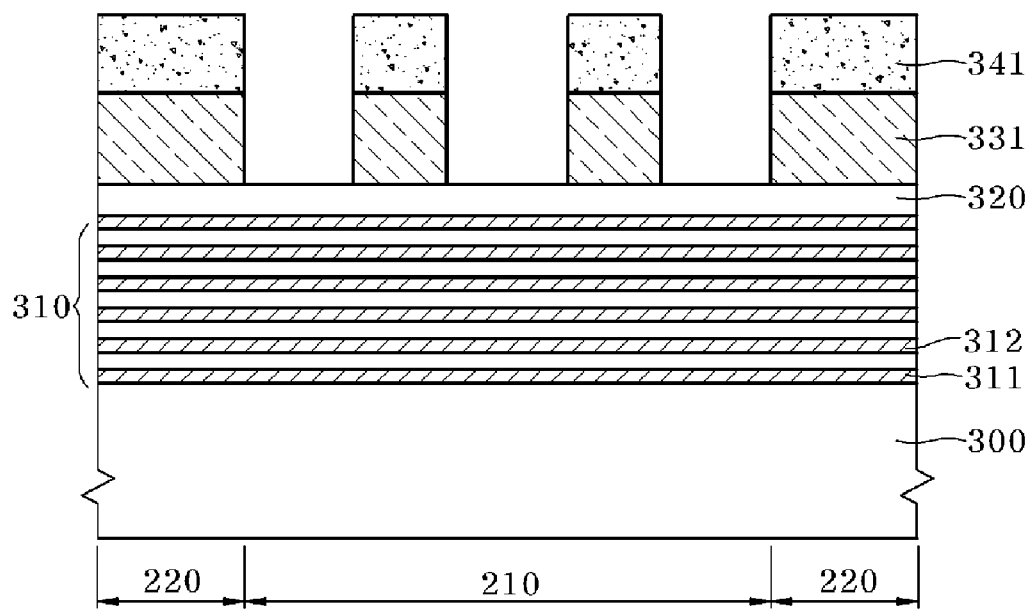

Referring to FIG. 3, an exposure process and a development process are performed to form an absorber pattern 341 and a phase shifter pattern 331, selectively exposing the capping layer 320. The phase shifter pattern 331 reflects the extreme ultraviolet light at a 180-degree phase difference from the first reflected light which is directly reflected by the reflection layer 310.

That is, the phase shifter pattern 331 disposed over the reflection layer 310 causes phase interference between the first reflected light, which is directly reflected from the reflection layer 310, and the second reflected light, which is reflected through the phase shifter pattern 331. The phase interference increases the contrast at a position where the phase of the first reflected light and the phase of the second reflected light are changed oppositely, and the increase of the contrast further improves the resolution of a pattern image transferred onto the wafer.

Figure 4:
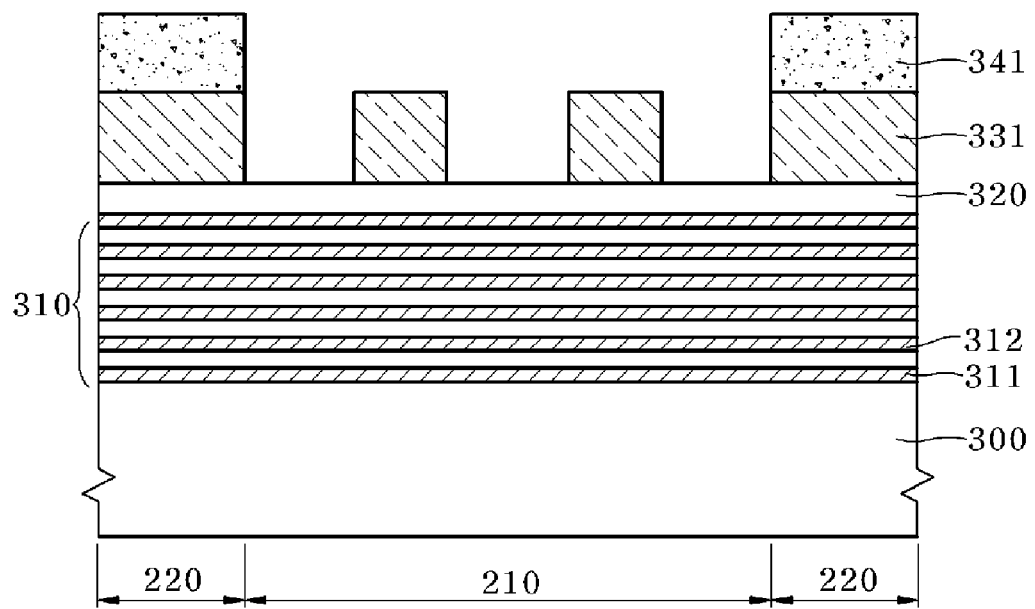

Referring to FIG. 4, the absorber pattern 341 above the phase shifter pattern 331 of the main chip region 210 is selectively removed. Consequently, the capping layer 320 and the phase shifter pattern 331 remain disposed over the reflection layer 310 in the main chip region 210. The capping layer 320, the phase shifter pattern 331, and the absorber pattern 341 are disposed over the reflection layer 310 in the frame region 220. The main chip region 210 corresponds to an exposure field region, which is transferred onto the wafer by a one-time exposure process, and the frame region 220 is a light shielding region, which is not used in substantially transferring patterns such as bar codes onto the wafer. The absorber pattern 341 disposed in the frame region 220 prevents the wafer from being exposed by the reflected light, even though alignment accuracy is degraded upon a blade setting of an exposure apparatus. That is, the absorber pattern 341 serves as a light shielding pattern that absorbs the light and prevents multiple exposure of the wafer, even if an alignment error occurs and it is overlapped with the adjacent exposure field region.

In order for the absorber pattern 341 to serve as the light shielding pattern, the optical density (OD) of the absorber pattern 341 must be maintained in a range from approximately 2.5 to approximately 3.0. The optical density is a scale that represents the degree to transmit the inside of a material or reflect the surface thereof. However, as the thickness of the absorber pattern 341 becomes thinner in order to suppress the shadow effect, the optical density of the absorber pattern cannot be maintained in a range from approximately 2.5 to approximately 3.0. Consequently, multiple exposure occurs during the wafer exposure process.

Figure 5:
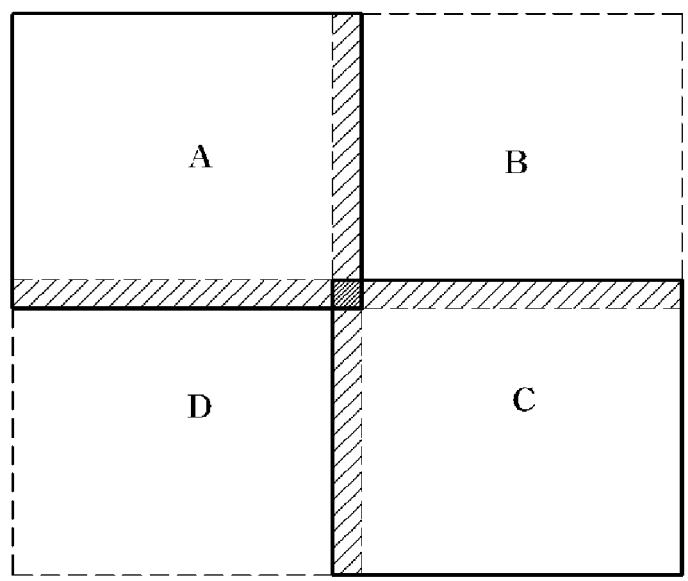

For example, from the overview of the result when the wafer is exposed using the photomask for extreme ultraviolet lithography, as illustrated in FIG. 5, a first exposure process is performed on a region "A" which is an exposure field region indicated by a solid line, and a second exposure process is performed on a region "B" indicated by a dashed line. Then, a third exposure process is performed on a region "C" indicated by a solid line, and a fourth exposure process is performed on a region "D" indicated by a dashed line. However, an overlapped region is formed between the adjacent exposure regions by the setting accuracy error, upon a blade setting in an exposure apparatus. In this case, if the absorber pattern serving as the light shielding pattern is formed too thin, multiple exposure is caused in the overlapped region. That is, the region "A" and the region "B" are overlapped with each other during the second exposure process, and the overlapped region is exposed by the extreme ultraviolet light during the first exposure process. Even though the frame region is exposed in the second exposure process, a two-fold exposure occurs because the absorber pattern is thin. Furthermore, as the exposure processes are sequentially performed, a four-fold exposure occurs in the region where the regions "A," "B," "C," and "D" are overlapped together.

Figure 6:
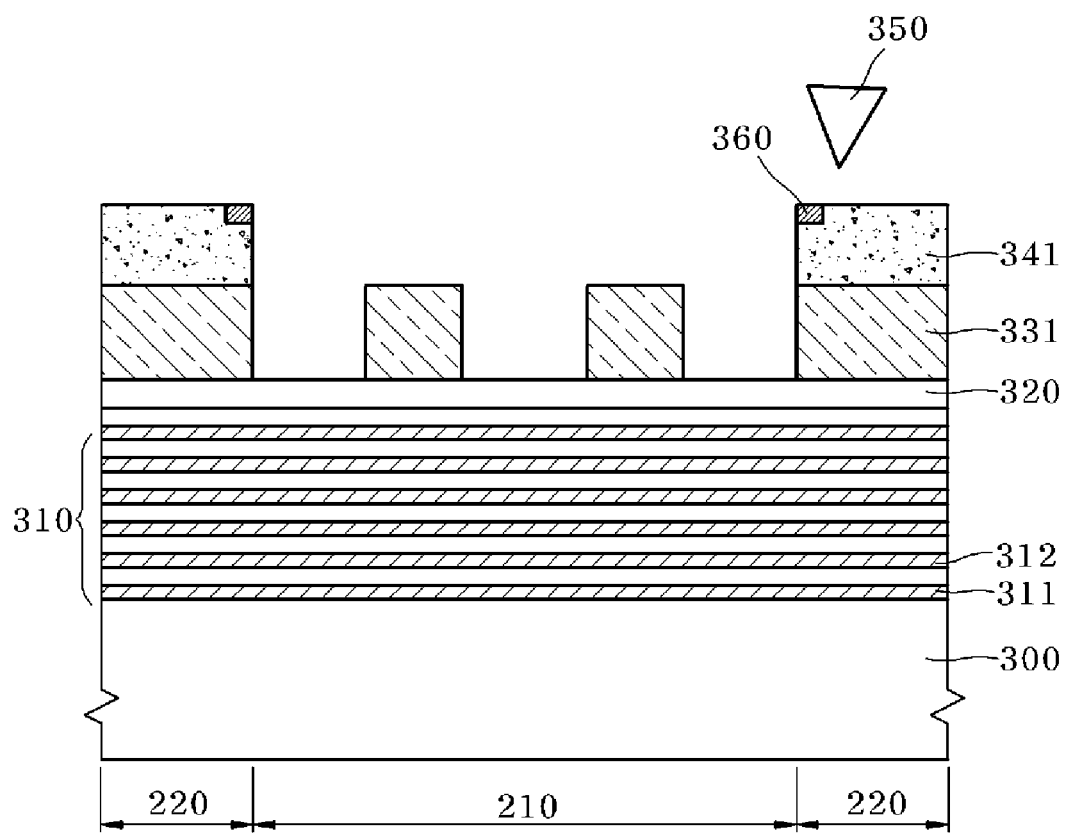
Figure 7:
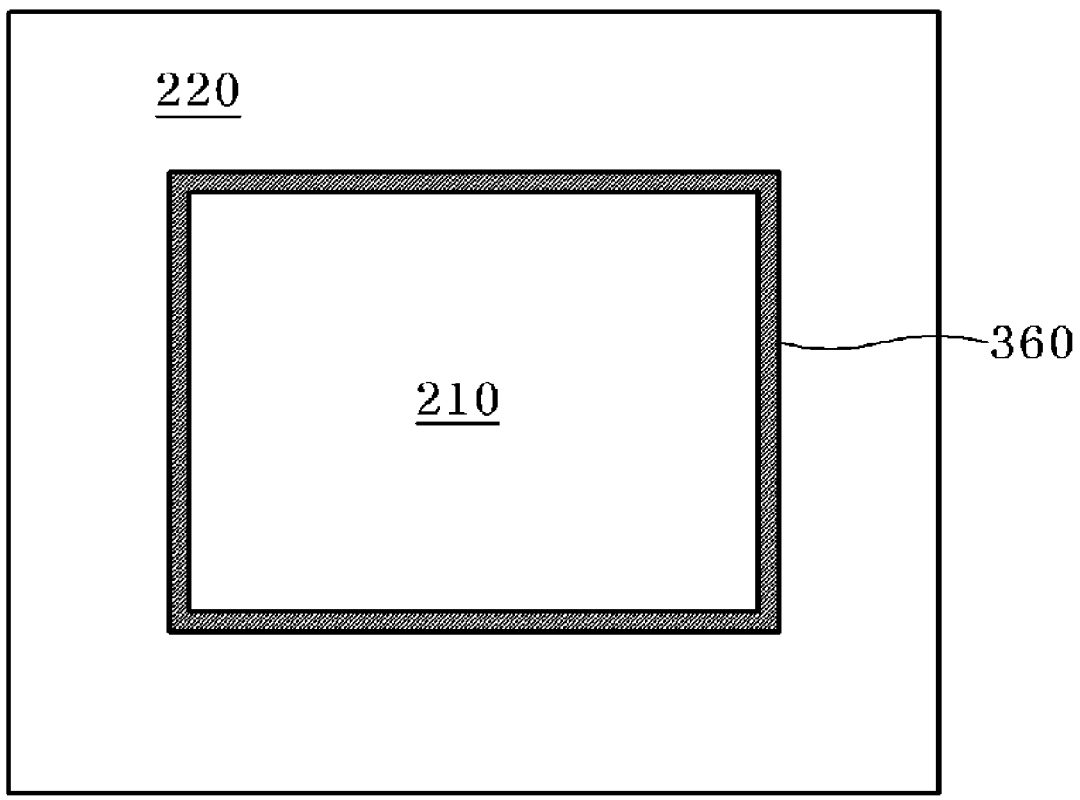

Referring to FIG. 6, a reflectivity reduction region 360 is formed in the absorber pattern 341 of the frame region 220. The reflectivity reduction region 360 improves the light-shielding effect of the absorber pattern 341 in order to prevent the multiple exposure. The reflectivity reduction region 360 is formed over the absorber pattern 341, and may be locally formed to surround the main chip region 210 at a width ranging from approximately 1 nm to approximately 2 nm from the boundary of the main chip region 210 and the frame region 220.

The reflectivity reduction region 360 is locally formed in a limited region by using a certain apparatus such as a tip nozzle. Specifically, a tip nozzle 350 of a repair apparatus is positioned over the absorber pattern 341. A doping material is injected into the limited region of the absorber pattern 341 through the tip nozzle 350. For example, a carbon doping region may be formed by injecting carbon as the doping material, or an oxygen doping region may be formed in the absorber pattern 341 by injecting gaseous oxygen. In this case, the doping material injected through the tip nozzle 350 may include oxides of carbon, oxides of nitrogen, or a hydrocarbon. The reflectivity reduction region 360 maintains the degraded optical density of the absorber pattern 341 of the frame region 220 in a range from approximately 2.5 to approximately 3.0.

The reflectivity reduction region 360 is locally formed at a distance where an error occurs in the exposure apparatus. The distance where an error occurs in the exposure apparatus corresponds to a region where an unwanted frame region 220 is exposed due to the low setting accuracy, upon the blade setting during the wafer exposure. An error occurs approximately 2 nm or less from the exposure apparatus. Therefore, as illustrated in FIG. 7, the reflectivity reduction region 360 is formed at a width ranging from approximately 1 nm to approximately 2 nm from the boundary of the main chip region 210 and the frame region 220. Thus, even though an alignment error occurs in the exposure apparatus as illustrated in FIG. 5, the multiple exposure may be prevented in the overlapped region between the adjacent exposure regions.

In the extreme ultraviolet phase shift mask having the phase shifter pattern over the reflection layer according to the embodiment of the present invention, the optical density of the frame region may be improved by artificially forming the reflectivity reduction region in the absorber pattern of the frame region. Consequently, it is possible to prevent the image contrast from being degraded in the multiple exposure region during the wafer exposure process.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A photomask for extreme ultraviolet lithography, comprising:
    a reflection layer disposed over a transparent substrate, the substrate having a main chip region and a frame region, the reflecting layer being capable of reflecting extreme ultraviolet light incident thereon;
    a phase shifter pattern disposed over the reflection layer and selectively exposing the reflection layer;
    an absorber pattern disposed over the phase shifter pattern of the frame region; and
    a reflectivity reduction region disposed in the absorber pattern, the reflectivity reduction region being capable of shielding the extreme ultraviolet light,
    wherein the reflectivity reduction region is formed by doping with at least one doping material selected from the group consisting of carbon-containing materials, nitrogen-containing materials, and oxygen gas onto the absorber pattern, the reflectivity reduction region has a height not more than a depth of the absorber pattern, and at least one surface of the reflectivity reduction region is exposed.

2. The photomask of claim 1, wherein the reflection layer comprises a plurality of double layers each comprising a molybdenum layer and a silicon layer.

3. The photomask of claim 1, wherein the phase shifter pattern is disposed to achieve a 180-degree phase difference between first and second reflected lights, wherein the first reflected light is reflected directly from the reflection layer and the second reflected light passes through the phase shifter pattern and then is reflected.

4. The photomask of claim 3, wherein the phase shifter pattern comprises a tantalum nitride (TaN) film having a thickness of approximately 58.2 nm to approximately 62.4 nm.

5. The photomask of claim 1, wherein the absorber pattern comprises a tantalum boron nitride (TaBN) or tantalum boron oxynitride (TaBON) film.

6. The photomask of claim 1, further comprising a capping layer disposed between the reflection layer and the phase shifter pattern.

7. The photomask of claim 1, wherein the reflectivity reduction region has a width of approximately 1 nm to approximately 2 nm, as measured from a boundary of the main chip region and the frame region.

8. The photomask of claim 1, wherein the doping material is selected from the group consisting of gaseous oxygen, oxides of carbon, oxides of nitrogen, and hydrocarbons.

9. A method for fabricating a photomask for extreme ultraviolet lithography, the method comprising:
- forming a reflection layer capable of reflecting extreme ultraviolet light incident thereon over a transparent substrate having a main chip region and a frame region;
- forming a phase shifter pattern over the reflection layer to selectively expose the reflection layer;
- forming an absorber pattern over the phase shifter pattern of the frame region; and
- forming a reflectivity reduction region in the absorber pattern, the reflectivity reduction region being capable of shielding the extreme ultraviolet light, and the height of the reflectivity reduction is not more than a thickness of the absorber pattern, and exposing at least one surface of the reflectivity reduction region,
- wherein the reflectivity reduction region is formed by doping with at least one doping material selected from the group consisting of carbon-containing materials, nitrogen-containing materials, and oxygen gas onto the absorber pattern.

10. The method of claim 9, wherein forming the reflection layer comprises stacking a plurality of double layers each comprising a molybdenum layer and a silicon layer.

11. The method of claim 9, wherein the phase shifter pattern is formed to achieve a 180-degree phase difference between first and second reflected lights, wherein the first reflected light is reflected directly from the reflection layer and a second reflected light passes through the phase shifter pattern and then is reflected.

12. The method of claim 11, wherein the phase shifter pattern comprises a tantalum nitride (TaN) film having a thickness of approximately 58.2 nm to approximately 62.4 nm.

13. The method of claim 9, wherein the absorber pattern comprises a tantalum boron nitride (TaBN) or tantalum boron oxynitride (TaBON) film.

14. The method of claim 9, further comprising, before forming the phase shifter pattern, forming a capping layer over the reflection layer.

15. The method of claim 9, wherein forming the reflectivity reduction region comprises introducing the doping material directly to the absorber pattern through a tip-shaped nozzle.

16. The method of claim 9, wherein the doping material is selected from the group consisting of oxides of carbon, oxides of nitrogen, and hydrocarbons.

17. The method of claim 9, wherein the reflectivity reduction region has a width of approximately 1 nm to approximately 2 nm, as measured from the boundary of the main chip region and the frame region.

* * * * *